(12) United States Patent
Pascucci

(10) Patent No.: US 6,320,440 B1
(45) Date of Patent: Nov. 20, 2001

(54) METHOD FOR SELECTIVELY ENABLING ALTERNATIVE CIRCUITS

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/611,258

(22) Filed: Jul. 6, 2000

Related U.S. Application Data

(63) Continuation of application No. 08/957,685, filed on Oct. 24, 1997, now Pat. No. 6,100,740.

(30) Foreign Application Priority Data

Oct. 25, 1996 (IT) .............................................. MI96A2210

(51) Int. Cl.⁷ .................................................. H03K 3/356
(52) U.S. Cl. ........................... 327/208; 327/210; 327/215
(58) Field of Search .................................. 327/199, 200, 327/208–210, 215, 525; 324/72.5

(56) References Cited

U.S. PATENT DOCUMENTS

| | | | |
|---|---|---|---|
| 4,614,881 | * | 9/1986 | Yoshia et al. .......................... 327/199 |
| 4,695,997 | * | 9/1987 | Montannari et al. ................... 370/13 |
| 5,715,239 | * | 2/1998 | Hyodo et al. .......................... 370/248 |
| 6,100,740 | * | 8/2000 | Pascucci ................................ 327/210 |

OTHER PUBLICATIONS

IBM Technical Disclosure Bulletin, vol. 30, No. 12, May 1988.*

* cited by examiner

*Primary Examiner*—Kenneth B. Wells
(74) *Attorney, Agent, or Firm*—E. Russell Tarleton; SEED IP Law Group, PLLC

(57) ABSTRACT

A circuit for selectively enabling one circuit from among a plurality of circuit alternatives of an integrated circuit, comprising selection circuit means for selecting one among said circuit alternatives. The selection means are controlled by bistable circuit means having a preferred state. Disactivatable forcing means associated to said bistable means are provided for forcing said bistable means in a state opposite than said preferred state, so that when said forcing means are disactivated the bistable circuit means automatically switch to said preferred state.

4 Claims, 2 Drawing Sheets

METHOD FOR SELECTIVELY ENABLING ALTERNATIVE CIRCUITS

This application is a continuation of pending U.S. patent application Ser. No. 08/957,685, filed Oct. 24, 1997, now U.S. Pat. No. 6,100,740.

TECHNICAL FIELD

The present invention relates to a circuit for selectively enabling one circuit from among a plurality of circuit alternatives of an integrated circuit.

BACKGROUND OF THE INVENTION

When designing integrated circuits, it is often necessary to choose from among several circuit alternatives, frequently each circuit alternative having quite different characteristics.

Choosing one circuit solution over the others possible involves the exclusion of the other circuit alternatives. However, it may happen that the solution chosen during the design phase is not practically the best one. Additionally, after one circuit solution has been chosen, switching to another alternative solution initially discarded involves remaking all or at least some of the photolithographic masks used in the manufacturing process. This obviously causes an increase in the manufacturing costs. Moreover, whenever one or more photolithographic masks have to be redesigned, there is always the possibility of incurring in new errors. This causes an increase in the testing phase.

Therefore, in practice the designer of an integrated circuit provides, whenever it is possible, for the implementation of more than one circuit alternative for at least some of the circuit blocks. The provision of such circuit alternatives, or "options," involves providing alternative metal interconnection lines that can be disabled during the testing of the device. For example, assuming that it is desired to provide more than one possibility for the control signal of a generic circuit block, it is possible to provide a multiplexer supplied with several signals, among which the one most suitable for driving the circuit block is to be determined. During the testing of the device, it is possible to deliberately interrupt some of the electrical interconnection lines in such a way that the multiplexer output switches among all the possible driving signals. Once the best circuit alternative has been determined, the photolithographic mask defining the metal interconnections, which is typically one of the last masks in the manufacturing process flow, will be redesigned so as to render the chosen alternative definitive.

However, configuring the multiplexer, or more generally configuring the combinatorial circuits that allow experimentation of more than one option, by interrupting the metal interconnection line has the disadvantage of leaving the inputs of the logic circuits connected to the interrupted interconnection lines floating, and not at a well-defined logic level. This causes indetermination of the integrated circuit performance and increases the device's power consumption because of the absence of well-defined logic levels.

In order to configure the combinatorial circuits that choose from among the several circuit alternatives possible, it is also possible to use programmable non-volatile memory elements. However, this approach normally complicates the manufacturing process because the process technology for the integration of the memory elements must be used.

Similarly, other testing solutions may be implemented. For example, using so-called "third-levels" of voltage applied to the input terminals of the integrated circuit. However, these solutions require the use of specially-designed circuits, which result in an increase in the design costs and in the device area.

SUMMARY OF THE INVENTION

According to the principles of the present invention, a circuit is provided for selectively enabling one circuit from among a plurality of circuit alternatives of an integrated circuit. The circuit provided does not involve overly complex circuit networks and does not require specific technological processes for its integration. The circuit allows for simple experimental testing of a plurality of alternative circuit solutions while overcoming the previously mentioned problems related to the absence of well-defined logic levels inside the integrated circuit, which may introduce anomalous current paths. It also does not require a complex redesign to implement the best circuit alternative once it has been determined.

According to the present invention, such object is attained by means of a circuit for selectively enabling one among a plurality of circuit alternatives of an integrated circuit, comprising selection circuit means for selecting one circuit from among the circuit alternatives. The selection means are controlled by a bistable circuit means having a preferred state. Disactivatable forcing means associated to the bistable means are provided for forcing the bistable means into a state opposite to the preferred state, so that when the forcing means are disactivated, the bistable circuit means automatically switches to the preferred state.

Thanks to the present invention, it is possible to test several alternative circuit solutions by simply integrating in the integrated circuit a small and simple network that can be realized in any technological process. The circuit of the present invention, comprising bistable means, does not introduce current consumption, particularly with regards to any current consumption caused by the uncertainty of the logic level of signals driving the logic gates. The circuit of the invention also does not require any complicated test procedures which are normally involved with the use of complex circuit networks.

These and other features and advantages of the present invention will be made apparent by the following detailed description of two particular embodiments thereof, illustrated as non-limiting examples in the annexed drawings.

DETAILED DESCRIPTION OF THE INVENTION

Figure 1A:
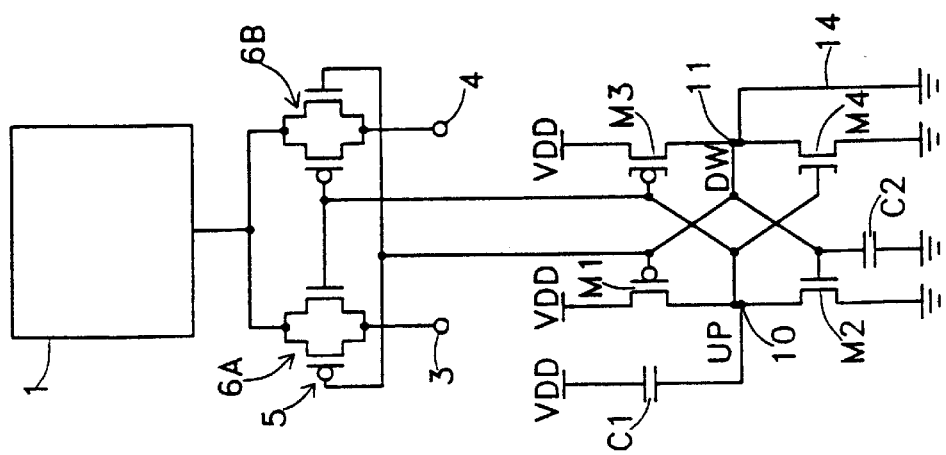
FIGS. 1A–1C show an embodiment of the circuit according to the present invention in a first operating condition, a second operating condition, and a final operating condition.

With reference to FIG. 1A, there is shown a circuit comprising a generic block 1 supplied with an input drive signal 2. In order to provide, during design, the possibility of choosing between connecting the input drive signal 2 of block 1 to a first drive signal 3 or to a second drive signal 4, input 2 of block 1 is connected to the output of a multiplexer 5 having as inputs signals 3 and 4. Multiplexer 5 is, for example, made up of a pair of transfer gates 6A and 6B, each one composed conventionally by a P-channel MOSFET and an N-channel MOSFET parallelly connected. Multiplexer 5 is controlled by two signals UP and DW, which are logical complements of each other. Signal UP controls the N-channel MOSFET of transfer gate 6A and the P-channel MOSFET of transfer gate 6B, while signal DW controls the P-channel MOSFET of transfer gate 6A and the N-channel MOSFET of transfer gate 6B.

Signals UP and DW form the outputs of a configuration circuit 7 formed by a latch. The latch comprises a first circuit branch 8 comprising a P-channel MOSFET M1 and an N-channel MOSFET M2 connected in series between a supply voltage VDD and ground, and a second circuit branch 9 also comprising a P-channel MOSFET M3 and an N-channel MOSFET M4 connected in series between voltage VDD and ground. Signal UP is taken from common node 10 between M1 and M2, which is also connected to the gate of M3 and M4. Similarly, signal DW is taken from the common node 11 between M3 and M4, which is also connected to the gate of M1 and M2. MOSFET M3 is fabricated to have a threshold voltage higher is absolute value (i.e., less negative) than MOSFET M1 in branch 8. Similarly, MOSFET M4 is fabricated to have a threshold voltage lower than MOSFET M2. In this way, latch 7 is unbalance, that is, it has a clear tendency to switch into the state with signal DW low and signal UP high. It is possible, even though not strictly necessary, to provide two capacitors C1 and C2, respectively connected between node 10 and voltage VDD, and between node 11 and ground. These capacitors enhance the tendency of the latch to switch into the above-referred state of DW low and UP being high.

FIG. 1A also shows an electrical link 12 if node 10 to ground. This link, which forces the latch 7 to take a state opposite than the one into which the latch 7 naturally will switch (i.e., into a state wherein node 10 is at the low logic level and node DW is at the high logic level), is provided during design as a normally-on option. In this condition, since signal UP is forced into the low logic level and signal DW forced into the high logic level, input 2 of block 1 is connected to drive signal 4, while the transfer gate 6A, being disabled, isolates the input 2 from the drive signal 3. In other words, even if during design two alternatives are provided, only one of said alternatives has been made active. In the example given above, the only alternative made active is the one wherein block 1 is driven by signal 4.

Figure 1B:
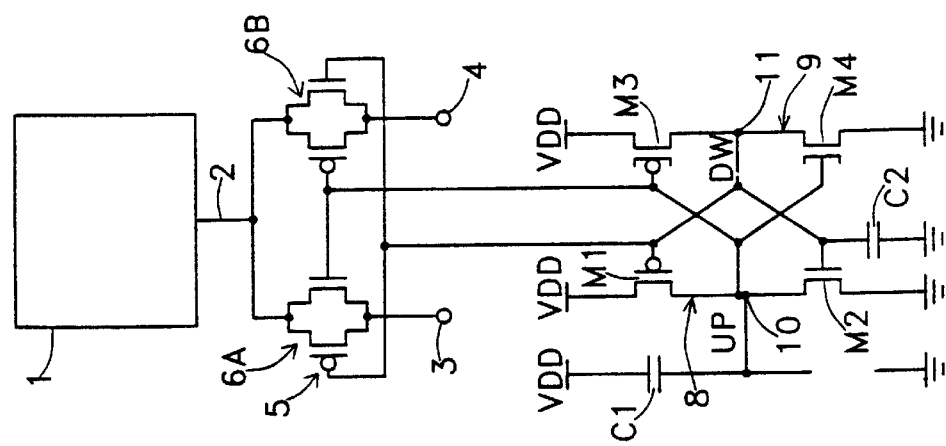

Now suppose that during testing of the device, after having completely determined the integrated circuit performance with the above-referred option, the other option is to be tested, that is, providing for driving block 1 with signal 3. To this purpose, it is sufficient to physically cut the interconnection line 12. This procedure is normally followed during testing of the integrated circuits. Once line 12 has been cut as shown in FIG. 1B, node 10 is no longer forced to ground, and latch 7 switches into the natural state where node UP is at the high logic level and node DW is at the low logic level. As a result, transfer gate 6B is disabled, and transfer gate 6A is enabled. The input 2 of block 1 is thus driven by drive signal 3. It is thus now possible to characterize the performance of the integrated circuit with this second option.

It should be noted that in neither of the preceding examples does the latch introduce current consumption because it is a CMOS circuit and the two conditions are stable operating conditions. Even after cut interconnection line 12, no signals with undefined logic levels exist.

Figure 1C:
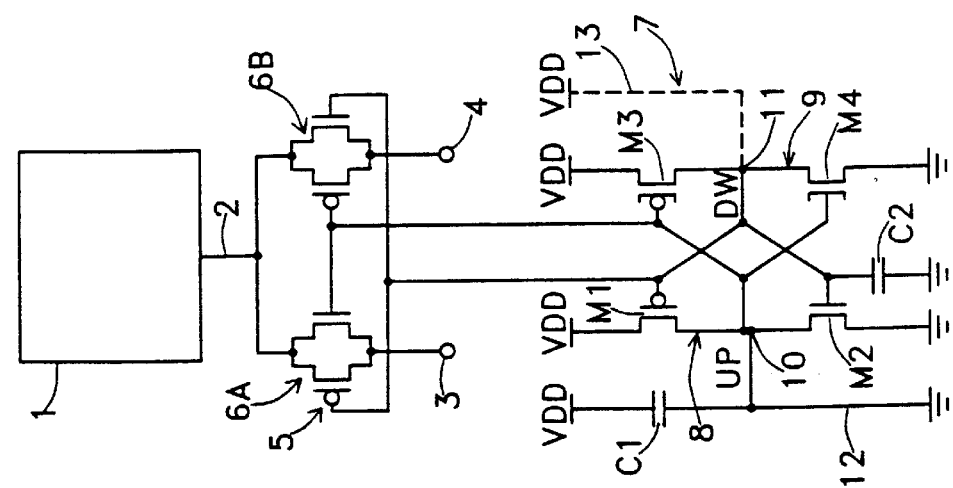

FIG. 1C shows a situation where, after having experimentally tested the alternative of FIG. 1B in which input 2 of block 1 is driven by signal 3 and having decided that this alternative is to be preferred to the one initially enabled in the design phase, the photolithographic masks have been modified to eliminate the electric interconnection of node 10 to ground. At the same time, since one or more photolithographic masks are to be modified, it is preferable to introduce an electric link 14 between node 11 and ground, so as to assure that latch 7 is brought into the state wherein node 11 is at the low logic level and node 10 is at the high logic level.

FIG. 1A also shows in dashed line an electric link 13 between node 11 and voltage VDD. This is a alternative embodiment of forcing the circuit to a particular state. This electric link can be provided during design or during testing phase in alternative to the link 12. In this case, latch 7 would also be forced in the unnatural condition with node 11 at the high level and node 10 at the low level. Cutting link 13, will allow latch 7 to switch into the natural state with node 11 at the low level and node 10 at the high level.

Figure 2:
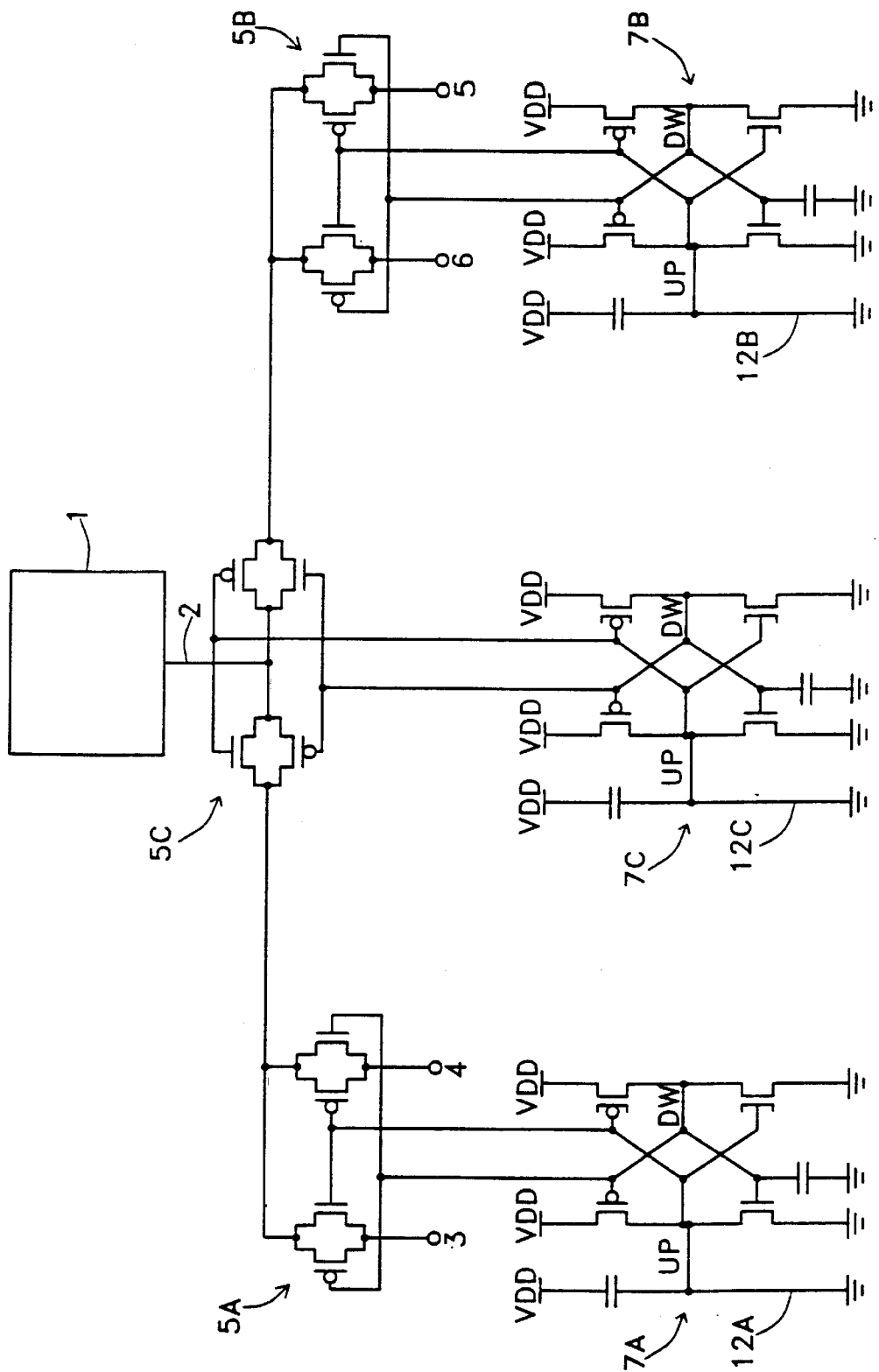
FIG. 2 shows a circuit according to another embodiment of the present invention.

FIG. 2 shows a second embodiment of the present invention. Differently from the previous embodiment, it is now assumed that the circuit alternatives to be tested are four instead of two, that is, the drive input 2 of block 1 could be driven by drive signal 3 or 4, as well as by signals 5 or 6. In this case, it is necessary to provide three multiplexers 5A, 5B and 5C identical to multiplexer 5 in FIG. 1A. The three multiplexers 5A, 5B and 5C are controlled, similarly to that shown in FIG. 1A, by three respective latches 7A, 7B and 7C identical to latch 7 in FIG. 1A and unbalanced as previously described. Latches 7A, 7B and 7C are forced in the condition opposite to the natural one by means of respective electric interconnection lines 12A, 12B and 12C. Cutting the electrical links 12A, 12B and 12C makes it possible to test in sequence each of the four possible options by connecting input 2 of circuit block 1 to either signals 3, 4 5 or 6.

What is claimed is:

1. A method for selectively enabling one of at least first and second circuit alternatives of an integrated circuit by means of selection circuit means controlled by a bistable circuit means, the selection circuit means having first and second states, the first and second states associated with the first and a second circuit alternatives, respectively, the first state being a preferred state, the method comprising the following steps:

providing the bistable circuit means with two circuit branches, a first circuit branch comprising a first and a second transistor, a second circuit branch comprising a third and a fourth transistor;

providing said first and fourth transistors with a turn-on voltage lower, in absolute value, than the turn-on voltage of the second and third transistors;

testing the first circuit alternative;

placing the bistable circuit means in the second state;

testing the second circuit alternative;

choosing between the first and second alternatives; and placing the bistable circuit means in the first or second state according to the chosen alternative.

2. The method according to claim 1 wherein the step of placing the bistable circuit means in the first or second state comprises a step of providing a photolithographic mask for forming metal interconnection lines of the integrated circuit in order to place the bistable circuit means in the chosen state.

3. A method for selectively enabling one of at least first and second circuit alternatives of an integrated circuit by means of a selection circuit controlled by a bistable circuit, the selection circuit having first and second states, the first and second states associated with first and second circuit alternatives, respectively, the first state being a preferred state, and the bistable circuit having at least two circuit branches, a first branch comprising first and second transistors, and a second branch comprising third and fourth transistors, the method comprising:

providing the first and fourth transistors with a turn-on voltage lower, in absolute value, than the turn-on voltage of the second and third transistors;

testing the first circuit alternative;

placing the bistable circuit in the second state;

testing the second circuit alternative;

choosing between the first and second circuit alternatives; and placing the bistable circuit in the first or second state according to the chosen alternative.

4. The method of claim 3 wherein placing the bistable circuit in the first or second state comprises providing a photolithographic mask for forming metal interconnection lines in the integrated circuit in order to place the bistable circuit in the chosen state.

* * * * *